United States Patent
Du et al.

(10) Patent No.: US 9,404,466 B2
(45) Date of Patent: Aug. 2, 2016

(54) METHOD FOR EVALUATING AN ENGINE STARTING SYSTEM

(71) Applicant: GM GLOBAL TECHNOLOGY OPERATIONS LLC, Detroit, MI (US)

(72) Inventors: Xinyu Du, Oakland Township, MI (US); Atul Nagose, Royal Oak, MI (US); Yilu Zhang, Northville, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 236 days.

(21) Appl. No.: 14/304,889

(22) Filed: Jun. 14, 2014

(65) Prior Publication Data

US 2015/0361941 A1    Dec. 17, 2015

(51) Int. Cl.
| | |
|---|---|
| *G01M 15/05* | (2006.01) |
| *F02N 11/10* | (2006.01) |
| *G01M 15/04* | (2006.01) |
| *G01K 13/00* | (2006.01) |
| *G01R 31/36* | (2006.01) |

(52) U.S. Cl.
CPC ............. *F02N 11/108* (2013.01); *G01K 13/00* (2013.01); *G01M 15/042* (2013.01); *G01M 15/048* (2013.01); *G01R 31/3606* (2013.01); *F02N 2200/045* (2013.01); *G01K 2205/00* (2013.01)

(58) Field of Classification Search
CPC ........... F02N 11/108; F02N 2200/045; G01M 15/042

USPC .............. 73/114.58, 114.59, 114.61, 114.77, 73/116.04

See application file for complete search history.

(56) References Cited

U.S. PATENT DOCUMENTS

| | | | |
|---|---|---|---|
| 7,743,649 B1 | 6/2010 | Salman et al. | |
| 8,055,460 B2 | 11/2011 | Rajagopalan et al. | |
| 8,234,036 B2 | 7/2012 | Shin et al. | |
| 2007/0103284 A1* | 5/2007 | Chew ................. | G01R 31/3693 340/438 |
| 2009/0115419 A1* | 5/2009 | Ueda .................. | G01R 31/3624 324/430 |
| 2010/0154524 A1* | 6/2010 | Salman ............... | F02N 11/0859 73/114.59 |
| 2010/0269776 A1* | 10/2010 | Mizuno .................. | F02D 29/06 123/179.4 |
| 2013/0046435 A1* | 2/2013 | Shin ........................ | F02N 11/08 701/32.8 |
| 2013/0317729 A1* | 11/2013 | Mitsuyama ............. | F02D 35/00 701/113 |
| 2015/0211469 A1* | 7/2015 | Ghoneim ............ | F02N 11/0825 701/113 |

* cited by examiner

*Primary Examiner* — Eric S McCall

(57) ABSTRACT

An internal combustion engine employs a starting system. A method for evaluating the starting system includes determining a cranking resistance ratio between a starter and a battery of the starting system during engine cranking. The cranking resistance ratio is normalized based upon an operating temperature of the starting system, and the starting system is evaluated based upon the normalized cranking resistance ratio.

17 Claims, 2 Drawing Sheets

METHOD FOR EVALUATING AN ENGINE STARTING SYSTEM

TECHNICAL FIELD

This disclosure relates to starting systems for internal combustion engines.

BACKGROUND

The statements in this section merely provide background information related to the present disclosure. Accordingly, such statements are not intended to constitute an admission of prior art.

Vehicle electrical systems include electric machines, e.g., motors and accessory drive devices that receive electric power from energy storage devices and are controlled by signals originating from control modules and other control devices and logic circuits. One electric circuit is a starting system that includes a starter motor coupled to a battery that spins an internal combustion engine when activated with an ignition switch. An operator-perceived fault in an engine starting system may result in a service procedure that includes replacing a starter motor or a battery without identifying and addressing a root cause of the perceived fault.

SUMMARY

An internal combustion engine employs a starting system. A method for evaluating the starting system includes determining a cranking resistance ratio between a starter and a battery of the starting system during engine cranking. The cranking resistance ratio is normalized based upon an operating temperature of the starting system, and the starting system is evaluated based upon the normalized cranking resistance ratio.

BRIEF DESCRIPTION OF THE DRAWINGS

One or more embodiments will now be described, by way of example, with reference to the accompanying drawings, in which.

DETAILED DESCRIPTION

Figure 1:
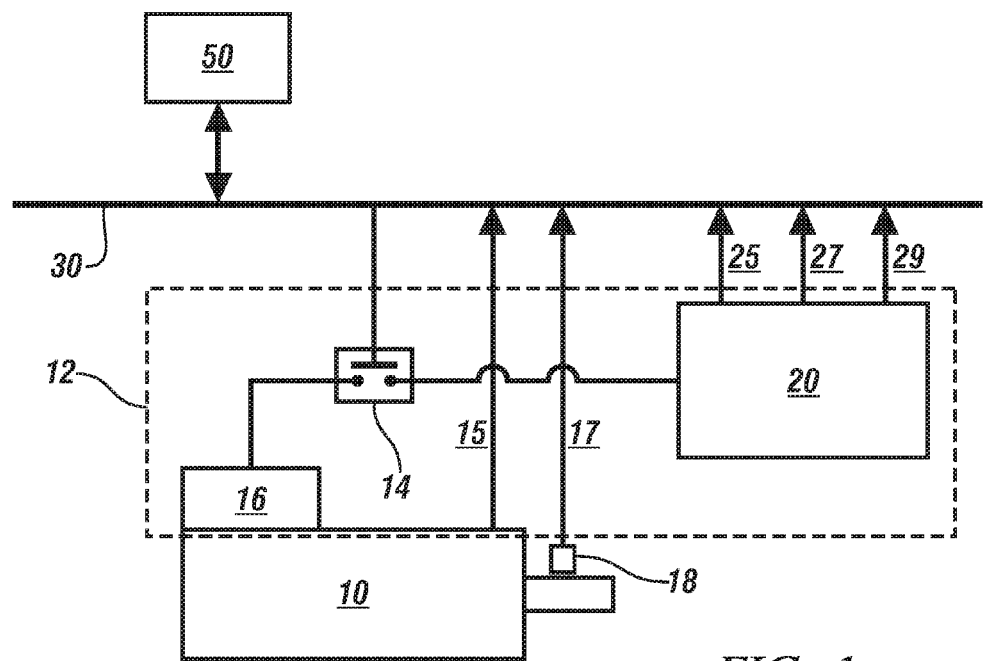
FIG. 1 illustrates an exemplary internal combustion engine including a starting system and a control system, in accordance with the disclosure.

Referring now to the drawings, wherein the showings are for the purpose of illustrating certain exemplary embodiments only and not for the purpose of limiting the same, FIG. 1 schematically shows an internal combustion engine 10 including a starting system 12 and a control system 50. The starting system 12 preferably includes an engine starter motor 16, an ignition switch 14 and a battery 20. In one embodiment the internal combustion engine 10 is an element of a powertrain system that is employed on a vehicle.

The engine 10 converts fuel stored in a fuel tank to mechanical power through a combustion process. The engine 10 is any internal combustion engine, and may be a multi-cylinder direct fuel injection internal combustion engine. The engine 10 is equipped with a plurality of actuators and sensing devices for monitoring operation and delivering fuel to form a combustion charge to produce torque that is responsive to an operator torque request. In one embodiment, the engine 10 is a spark-ignition engine configured to operate as a spark-ignition combustion mode with combustion controlled by a spark ignition system, and may include operation in a homogeneous charge spark-ignition combustion mode. Alternatively, the engine 10 may be a compression-ignition engine configured to operate in a compression-ignition combustion mode with combustion controlled by timing of injected fuel. Engine actuators preferably include fuel injectors, air flow controllers, spark-ignition systems on engines so equipped, and other devices associated with controlling engine operation to control operation of the engine. Engine sensing devices preferably include a coolant temperature sensor or other device for monitoring engine temperature 15 and a crankshaft position sensor 18 configured to monitor rotational speed 17 of the engine 10. The engine 10 may be configured to operate in either an engine ON state or an engine OFF state during ongoing powertrain operation. The engine ON state includes any state in which the engine crankshaft is rotating, including a deceleration fuel cutoff state. The engine OFF operation is an engine state wherein the engine crankshaft is not rotating and the engine 10 is unfueled.

The battery 20 may be any electrical energy storage device, and in one embodiment is a multi-celled low-voltage lead-acid battery. Monitored parameters of the battery 20 include battery temperature 25, battery voltage 27, and battery current 29, with such monitoring achieved by direct measurement employing sensing devices, inferred from information provided from sensing devices, estimated or otherwise determined using suitable systems. A battery state-of-charge (SOC) parameter may be determined from the monitored parameters, as is known to those having ordinary skill in the art. The control system 50 is configured to determine the SOC parameter using information including the battery voltage 27 and battery current 29.

The starter motor 16 may include any engine cranking device, and is a permanent-magnet DC electric motor with an attached starter solenoid in one embodiment. In such an embodiment, a rotatable shaft of the starter motor 16 includes a moveable drive pinion gear that is configured to meshingly engage a starter ring gear attached to a crankshaft of the engine 10 when the starter solenoid is activated during a cranking event. When the ignition switch 14 is activated, electric current is supplied to the starter solenoid to cause the moveable drive pinion gear to meshingly engage the starter ring gear attached to the crankshaft of the engine 10 and supply electric current to spin the starter motor 16, thus spinning the engine 10. In one embodiment, the starter motor 16 may include a temperature sensor.

The ignition switch 14 is configured to initiate an engine starting event by electrically connecting the engine starter motor 16 to the battery 20 in response to an operator key-on command or in response to an autostart command. It is appreciated that the engine speed is 0 RPM, i.e., the engine is in an OFF state and is not rotating prior to initiating the engine starting event. A key-on engine starting event is executed in response to an operator key-on command to the ignition switch 14, for example when an operator first enters a vehicle to begin a trip. It is appreciated that a key-on engine starting event includes a remote-start event and other similar operations. An autostart engine starting event is executed in response to a command from the control system 50 to activate the ignition switch 14, for example subsequent to an autostop command during ongoing vehicle operation.

The control system 50 is configured to control operation of the engine 10 during each engine starting event. An engine starting event includes engine cranking coincident with engine fueling and spark (on spark-ignition engines) that is executed to transition the engine from the OFF state to the ON state. Each engine starting event preferably includes a command to start the engine 10 wherein the ignition switch 14 is activated to electrically connect the starter motor 16 to the battery 20, causing the starter motor 16 to spin and thus crank the engine. The control system 50 coincidentally controls engine fueling and spark (on spark-ignition engines) to effect engine starting by executing other engine control functions related to fueling and firing the engine 10.

The controller 50 executes the engine stop/start function to automatically stop (autostop) and automatically restart (autostart) engine operation during ongoing vehicle operation in response to operator commands and on-vehicle demands. By way of example, an autostop command may be executed to achieve the engine OFF state when a vehicle is in a stopped condition, such as when waiting at a traffic light. An autostart engine starting event is executed in response to a command from the control system 50 to activate the starter switch, for example subsequent to an autostop command during ongoing vehicle operation. The engine can execute a starting event to operate in the engine ON state in response to an autostart command caused by an operator action such as depressing an accelerator pedal.

Control module, module, control, controller, control unit, processor and similar terms mean any one or various combinations of one or more of Application Specific Integrated Circuit(s) (ASIC), electronic circuit(s), central processing unit(s) (preferably microprocessor(s)) and associated memory and storage (read only, programmable read only, random access, hard drive, etc.) executing one or more software or firmware programs or routines, combinational logic circuit(s), input/output circuit(s) and devices, appropriate signal conditioning and buffer circuitry, and other components to provide the described functionality. Software, firmware, programs, instructions, routines, code, algorithms and similar terms mean any instruction sets including calibrations and look-up tables. The control module has a set of control routines executed to provide the desired functions. Routines are executed, such as by a central processing unit, and are operable to monitor inputs from sensing devices and other networked control modules, and execute control and diagnostic routines to control operation of actuators. Routines may be executed at regular intervals, for example each 100 microseconds, 3.125, 6.25, 12.5, 25 and 100 milliseconds during ongoing engine and vehicle operation. Alternatively, routines may be executed in response to occurrence of an event. Information transfer to and from the control system 50 may be accomplished using one or more communications paths, e.g., communications bus 30, which may include one or more of a direct connection, a local area network bus, and a serial peripheral interface bus.

Figure 2:
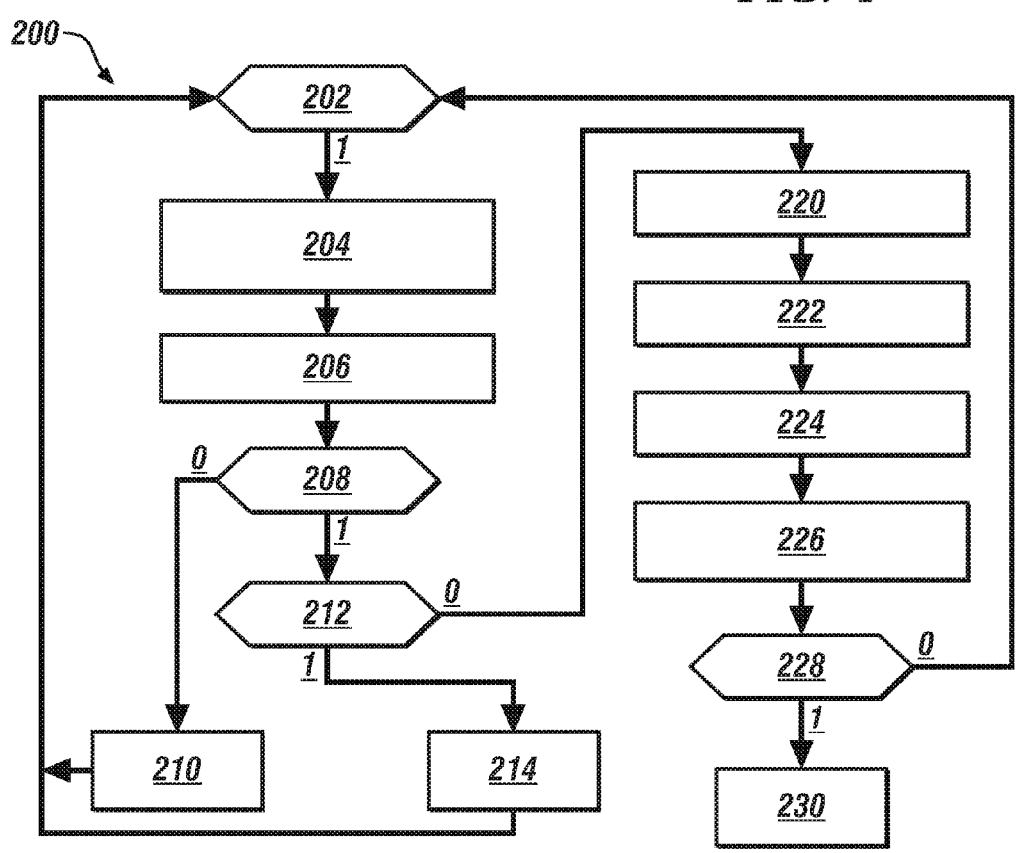
FIG. 2 illustrates a cranking resistance routine in flowchart form for evaluating a starting system for an internal combustion engine, in accordance with the disclosure.

The starting system of the internal combustion engine is evaluated by determining a temperature-normalized cranking resistance ratio between the starter and the battery, as described with reference to FIGS. 2 and 3. FIG. 2 schematically depicts an embodiment of the cranking resistance routine 200 in flowchart form for evaluating a starting system for an internal combustion engine, e.g., an embodiment of the starting system 12 and the engine 10 described with reference to FIG. 1. The cranking resistance routine 200 is preferably executed in the control module 50 as one or more routines and associated calibrations to determine a temperature-normalized cranking resistance ratio for the starting system. The temperature-normalized cranking resistance ratio for the starting system monitors successive iterations of engine starting events during vehicle operation and evaluates the starting system to detect presence of a fault in one of the starter and the battery upon occurrence. Table 1 is provided as a key to FIG. 2 wherein the numerically labeled blocks and the corresponding functions are set forth as follows.

TABLE 1

| BLOCK | BLOCK CONTENTS |
|---|---|
| 200 | Cranking Resistance Routine |
| 202 | Engine cranking? |
| 204 | Monitor vehicle data related to engine starting |
| 206 | Identify and remove cranking voltage outliers when $V_{min}(k) > Th2$ OR $V_{min}(k) < Th2$ and $V_{min}(k) > Th3$ and $\Delta V_{min}(k) > Th4$ and $\Delta V_{min}(k) = V_{min}(k) - \text{mean } V_{min}(i)$, $i = 1$ to $k$ OR $V_{min}(k) < Th5$ |
| 208 | Is all monitored vehicle data related to engine starting available? |
| 210 | Assign NA value as output |
| 212 | Is start-up SOC a default value? and Is Min_V < Th6? |
| 214 | Assign Default calibration value |
| 220 | Determine OCV, e.g., Convert Start-up SOC to OCV |
| 222 | Calculate cranking resistance ratio |
| 224 | Determine (e.g., estimate) starter temperature |
| 226 | Normalize the cranking resistance ratio for temperature |
| 228 | Evaluate temperature-normalized cranking resistance ratio |
| 230 | Notify vehicle operator of fault |

A vehicle employing an internal combustion engine may employ the engine starting system to start the engine at the beginning of a key-on cycle, and may also start and stop the engine multiple times during a key-on cycle in response to autostart and autostop commands on a vehicle that is so configured. The cranking resistance routine 200 preferably executes once each time the engine starts.

The cranking resistance routine 200 initiates execution when engine cranking is detected (202)(1) by monitoring and capturing vehicle parameters related to engine starting at the beginning, during or at the end of engine cranking during an engine starting event (204). Preferred vehicle parameters related to engine starting include, but may not be limited to a battery state of charge (SOC) and/or an open circuit voltage (OCV) if available, battery temperature ($T_b$), an engine-off time ($t_{off}$), and a minimum cranking voltage ($V_{min}$). Measurement of the battery current is unnecessary, and the measurement of battery voltage is limited to detecting only a single datapoint indicating minimum cranking voltage ($V_{min}$) during engine starting. The vehicle parameters may be directly measured, inferred from direct measurements, estimated, or otherwise determined using measurements, predetermined calibrations, estimation routines, and other suitable methods.

The captured vehicle parameters for each starting event are evaluated to identify cranking voltage outliers and such outliers are removed from analysis when evaluating the starting system (206). This evaluation includes removing the captured vehicle parameters for a starting event k if the minimum cranking voltage for the present iteration ($V_{min}(k)$) is greater than a first threshold ($V_{min}(k) > Th2$), wherein the first threshold Th2 is vehicle-dependent, and is 11.0V in one embodiment. This evaluation also includes removing the captured vehicle parameters for a starting event k if the minimum cranking voltage for the present iteration is less than the first threshold ($V_{min}(k)<Th2$) and is greater than a second threshold ($V_{min}(k)>Th3$) and $\Delta V_{min}(k)>Th4$ wherein $\Delta V_{min}(k)=V_{min}(k)-\text{mean } V_{min}(i)$, i=1 to k, wherein the second threshold Th3 is vehicle-dependent, preferably less than 12V, and is 10.5V in one embodiment and the third threshold Th4 is also vehicle-dependent, and has a magnitude of 1.0V in one embodiment. This evaluation also includes removing the captured vehicle parameters for a starting event k if the minimum cranking voltage for the present iteration is less than a fourth threshold ($V_{min}(k)<Th5$). wherein the fourth threshold Th5 is also vehicle-dependent and has a magnitude of 1.0V in one embodiment. The aforementioned thresholds are determined by capturing minimum cranking voltage for a vehicle model of interest over time to identify an expected normal range for a starting system functioning in accordance with specifications and for a faulty starting system.

The captured data is evaluated to determine whether the monitored vehicle data related to engine starting is available (208). If the vehicle data is not available (208)(0), the dataset is assigned a "not available" (NA) value as an output (210) and this iteration ends. If the vehicle data is available (208)(1), the start-up SOC is evaluated to determine if it is a default value, and the minimum cranking voltage for the present iteration ($V_{min}(k)$) is evaluated to determine if it is less than a fifth threshold ($V_{min}(k)>Th6$) (212). This operation is intended to evaluate the health of the battery. If the aforementioned conditions are met, i.e., the SOC is a default value and the minimum cranking voltage is less than the fifth threshold ($V_{min}(k)>Th6$) (212)(1), a default calibrated value for the cranking resistance ratio is assigned (214) and this iteration ends. If the aforementioned conditions are not met (212)(0), it is an indication that the engine starting system is operating in a manner that is suitable for evaluation. An evaluation of the engine starting system includes employing an equivalent electrical circuit to develop relationships between the various circuit elements.

Figure 3:
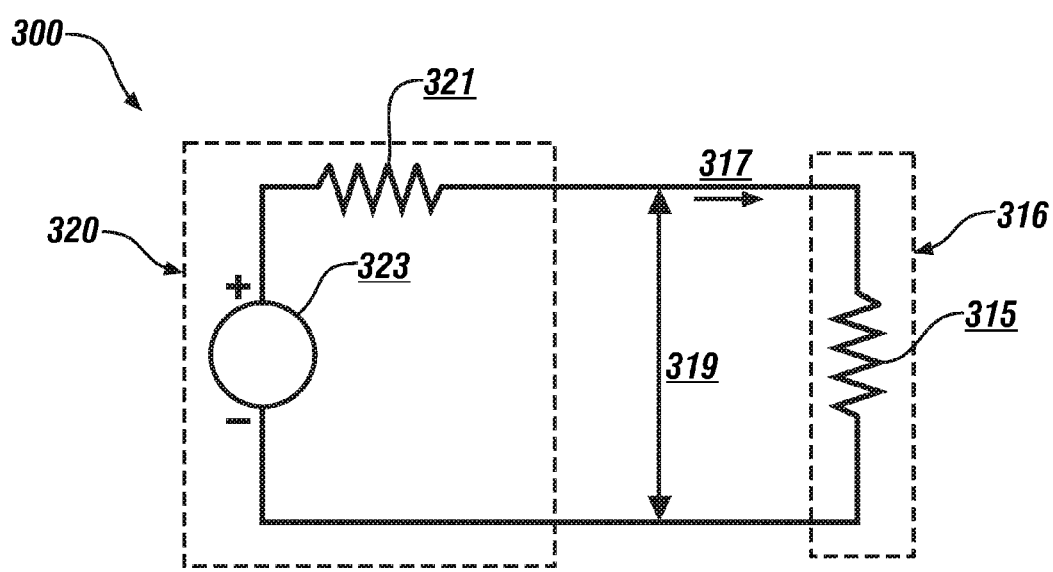
FIG. 3 illustrates an equivalent electrical circuit that can be employed as an analytic model of an engine starting system including a battery and starter, in accordance with the disclosure.

FIG. 3 schematically shows an embodiment of an equivalent electrical circuit 300, which can employed as an analytic model of an engine starting system including a battery 320 and starter 316. Parameters of interest include a battery resistance $R_b$ 321, open circuit voltage OCV 323, maximum starting current $I_{max}$ 317, minimum cranking voltage $V_{min}$ 319, and starter resistance $R_s$ 315. The equivalent circuit can be modeled in accordance with the following relationship.

$$I_{max} = \frac{OCV - V_{min}}{R_b} = \frac{V_{min}}{R_s} \quad [1]$$

The operation proceeds to determining the open circuit voltage (OCV) for the battery during the engine starting event (220), which can be accomplished by direct measurement if available, or executing a control routine that converts the SOC that is determined during engine starting to OCV.

The minimum cranking voltage $V_{min}$ relates to the OCV in accordance with the following relationship:

$$V_{min} = \frac{OCV \times R_s}{R_b + R_s} = \frac{OCV}{R_b/R_s + 1} \quad [2]$$

wherein $R_b$ is battery resistance, and
$R_s$ is starter resistance.

A cranking resistance ratio r is defined as a ratio between the battery resistance $R_b$ and starter resistance $R_s$ and can be determined (222) as a ratio of the open circuit voltage and the minimum cranking voltage $V_{min}$ employing Eq. 2. The cranking resistance ratio r can be defined with regard to the equivalent electrical circuit 300 of FIG. 3 in accordance with the following relationship.

$$R_b/R_s \triangleq r = \frac{OCV}{V_{min}} - 1 \quad [3]$$

Starter temperature $T_s$ is determined (224), and can be directly measured using some form of temperature sensor. Alternatively, the starter temperature $T_s$ can be estimated employing the battery temperature and an empirically developed thermal model. In one embodiment, an empirical model is set forth in accordance with the following relationship:

$$T_s = \begin{cases} T_b + ae^{bt_{off}}, & \text{if } t_{off} \le Th1 \\ T_b, & \text{if } t_{off} > Th1 \end{cases} \quad [4]$$

wherein $T_b$ is battery temperature, $t_{off}$ is engine-off time, a and b are application-specific fitting coefficients that are pre-calibrated for a known system, and Th1 is a threshold time period for engine-off, which is application-specific and indicates a period of time required for the starter motor to achieve ambient temperature.

Exemplary empirical models to determine the starter temperature fitting coefficients a and b are described with reference to Eqs. 8-11.

The cranking resistance ratio r is normalized based upon a temperature of the starting system to achieve a normalized cranking resistance ratio $r_0$ that eliminates effects of component and ambient temperatures on the resistances of the starter and battery (226). In one embodiment the normalized cranking resistance ratio $r_0$ accounts for and compensates for battery temperature $T_b$ and starter temperature $T_s$ in accordance with the following relationship:

$$r_0 = r \times \frac{1 + \beta(T_s - Tnom)}{1 - \alpha(T_b - Tnom)} \quad [5]$$

wherein $r_0$ is the normalized cranking resistance ratio,

Tnom is a nominal temperature, e.g., 25° C. in one embodiment, and

α and β are temperature coefficients.

The α temperature coefficient relates to the battery and has a value of 0.0015/° C. for one battery model, and the β temperature coefficient relates to the starter and has a value of 0.00395/° C. for one starter model.

The temperature coefficients α and β can be determined for a given starting system by soaking the starting system including the battery at different temperature conditions, which relate to the battery temperature $T_b$. The battery resistance $R_b$ can be determined based upon values for OCV, $I_{max}$ and $V_{min}$ that are measured, estimated, or otherwise determined during subsequent cold engine starting events in accordance with the following relationship.

$$R_b = \frac{OCV - V_{min}}{I_{max}} \quad [6]$$

The $\alpha$ temperature coefficient can be determined in accordance with the following relationship:

$$Rb = (1-\alpha(Tb-Tnom)) \times R_{b,Tnom} \quad [7]$$

wherein $R_{b,Tnom}$ is battery resistance at a nominal battery temperature Tnom, which is 25° C. in one embodiment.

The normalized cranking resistance ratio $r_0$ is determined from vehicle data collected with battery temperature Tb at a nominal temperature of 25° C. after an extended soak period ($t_{off}$>Th1) and with the SOC greater than 50% for a nominal 12V lead-acid battery. The $\beta$ temperature coefficient can be determined using Eq. 5 when the $\alpha$ temperature coefficient is determined.

The starter temperature fitting coefficients a and b can be determined using an off-board calibration technique that includes collecting data during engine starting with the SOC>50% or another suitable SOC magnitude, and determining a magnitude of the Th1 threshold based upon a standard deviation of the normalized cranking resistance ratio $r_0$. A mean value for the normalized cranking resistance ratio $r_0$ is calculated for data points taken when the engine off time $t_{off}$ is greater than the extended soak period ($t_{off}$>Th1). Starter temperatures $T_s$ are calculated for operating periods when the engine off time $t_{off}$ is substantially less than the extended soak period ($t_{off}$<<Th1), in accordance with the following relationship.

$$T_s = \frac{\frac{r_0}{r}(1-\alpha(T_b - Tnom))-1}{\beta} + Tnom \quad [8]$$

An empirical model can be fit using battery temperature Tb and the extended soak period ($t_{off}$) to determine the starter temperature fitting coefficients a and b. In one embodiment, the empirical model to determine the starter temperature fitting coefficients a and b is a linear model derived with the collected data in accordance with the following relationship.

$$f(T_b, t_{off}) = \alpha T_b + b t_{off} + c \quad [9]$$

In one embodiment, the empirical model to determine the starter temperature fitting coefficients a and b is a lumped thermal mass model derived with the collected data in accordance with the following relationship.

$$f(T_b, t_{off}) = T_b + a e^{-b t_{off}} \quad [10]$$

In one embodiment, the empirical model to determine the starter temperature fitting coefficients a and b is a lumped thermal mass model with a linear approximation derived with the collected data in accordance with the following relationship.

$$f(T_b, t_{off}) = T_b + \alpha t_{off} + b \quad [11]$$

Other empirical models may be employed with similar effect and results.

The temperature-normalized cranking resistance ratio $r_0$ for this iteration is evaluated and analyzed in combination with other data such as SOC and temperature (228), and when found to be less than a predetermined threshold ratio (228)(0), a fault is indicated and the vehicle operator is notified (230).

Otherwise (228)(1), this iteration ends and operation continues with waiting for a subsequent engine starting event to resume execution (202).

Normalizing the cranking resistance ratio r improves the robustness of the starting system health indicator (e.g. Minimum cranking voltage) in relation to variations in battery SOC, battery temperature and starter temperature. A standard deviation of the cranking resistance ratio for a given vehicle is considerably lower than the minimum cranking voltage over a period of time. Furthermore, the effects of changes in SOC and temperature are reduced by normalizing cranking resistance ratio, which makes it easier to evaluate the health of the system over multiple ignition cycles with varying operating conditions.

The concepts described herein convert the minimum cranking voltage to resistance ratio i.e., battery resistance over starter resistance and normalize the resistance to battery temperature and starter temperature. The equivalent circuit model can be employed to convert the minimum cranking voltage and open circuit voltage to a resistance ratio. The thermal model of battery and starter permits normalizing the resistance ratio to battery temperature and starter temperature. The starter temperature during cranking can be estimated with an empirical model.

The system described herein can be implemented onboard a vehicle or off-board a vehicle using a remotely located diagnostic center, and applies to different battery configurations including AGM or flooded SLI lead-acid batteries. No additional hardware costs are required, and no extra battery sensors are required. Furthermore, no additional diagnostic trouble codes are required. It instead provides a passive monitoring system that has low requirements for computational power and memory storage.

The disclosure has described certain preferred embodiments and modifications thereto. Further modifications and alterations may occur to others upon reading and understanding the specification. Therefore, it is intended that the disclosure not be limited to the particular embodiment(s) disclosed as the best mode contemplated for carrying out this disclosure, but that the disclosure will include all embodiments falling within the scope of the appended claims.

The invention claimed is:

1. A method for evaluating a starting system for an internal combustion engine, comprising:
   determining a cranking resistance ratio between a starter and a battery of the starting system during engine cranking;
   normalizing the cranking resistance ratio based upon an operating temperature of the starting system; and
   evaluating the starting system based upon the normalized cranking resistance ratio.

2. The method of claim 1, wherein the cranking resistance ratio between the starter and the battery is determined based upon an equivalent circuit analytic model of the starting system.

3. The method of claim 2, wherein the equivalent circuit analytic model of the starting system takes the form of the following relationship:

$$R_b/R_s \triangleq r = \frac{OCV}{V_{min}} - 1$$

wherein r is the cranking resistance ratio,
   $R_b$ is a battery resistance,
   $R_s$ is a starter resistance, OCV is an open circuit voltage during cranking, and
$V_{min}$ is a minimum cranking voltage during the engine cranking.

4. The method of claim 3 wherein $V_{min}$ is determined by capturing a single cranking voltage data point during the engine cranking.

5. The method of claim 1, wherein the cranking resistance ratio is normalized in accordance with the following relationship:

$$r_0 = r \times \frac{1 + \beta(T_s - Tnom)}{1 - \alpha(T_b - Tnom)}$$

wherein $r_0$ is the normalized cranking resistance ratio,
r is the cranking resistance ratio,
$T_b$ is battery temperature,
$T_s$ is starter temperature,
Tnom is a nominal battery temperature, and
α and β are predetermined temperature coefficients.

6. The method of claim 5, wherein the starter temperature $T_s$ is determined based upon the battery temperature $T_b$.

7. The method of claim 6, wherein the starter temperature $T_s$ is determined in accordance with the following relationship:

$$T_s = \begin{cases} T_b + ae^{b \cdot t_{off}}, & \text{if } t_{off} \leq Th1 \\ T_b, & \text{if } t_{off} > Th1 \end{cases}$$

wherein $t_{off}$ is engine-off time,
a and b are application-specific fitting coefficients that are pre-calibrated for a known system, and
Th1 is a threshold time period for engine-off indicating a period of time required for the starter motor to achieve ambient temperature.

8. A method for evaluating a starting system for an internal combustion engine, comprising:
determining a cranking resistance ratio between a starter and a battery of the starting system based upon a single datapoint comprising a minimum cranking voltage captured during engine cranking;
normalizing the cranking resistance ratio based upon an operating temperature of the starting system; and
evaluating the starting system based upon the normalized cranking resistance ratio.

9. The method of claim 8, wherein the cranking resistance ratio between the starter and the battery based is determined in accordance with the following relationship:

$$R_b / R_s \triangleq r = \frac{OCV}{V_{min}} - 1$$

wherein r is the cranking resistance ratio,
$R_b$ is a battery resistance,
$R_s$ is a starter resistance,
OCV is an open circuit voltage during cranking, and
$V_{min}$ is the single datapoint comprising the minimum cranking voltage captured during the engine cranking.

10. The method of claim 8, wherein the cranking resistance ratio is normalized in accordance with the following relationship:

$$r_0 = r \times \frac{1 + \beta(T_s - Tnom)}{1 - \alpha(T_b - Tnom)}$$

wherein $r_0$ is the normalized cranking resistance ratio,
r is the cranking resistance ratio,
$T_b$ is battery temperature,
$T_s$ is starter temperature,
Tnom is a nominal battery temperature, and
α and β are predetermined temperature coefficients.

11. The method of claim 10, wherein the starter temperature $T_s$ is based upon the battery temperature $T_b$.

12. The method of claim 11, wherein the starter temperature $T_s$ is determined in accordance with the following relationship:

$$T_s = \begin{cases} T_b + ae^{b \cdot t_{off}}, & \text{if } t_{off} \leq Th1 \\ T_b, & \text{if } t_{off} > Th1 \end{cases}$$

wherein $t_{off}$ is engine-off time,
a and b are application-specific fitting coefficients that are pre-calibrated for a known system, and
Th1 is a threshold time period for engine-off indicating a period of time required for the starter motor to achieve ambient temperature.

13. A method for monitoring an electrical starting system for an internal combustion engine, comprising detecting a fault with one of a starter motor and a battery when a cranking resistance ratio determined between a cranking voltage and an open circuit voltage of the battery is greater than a predetermine threshold, said cranking resistance ratio normalized based upon a temperature of the battery.

14. The method of claim 13, wherein the cranking resistance ratio between the cranking voltage and the open circuit voltage of the battery is determined in accordance with the following relationship:

$$R_b / R_s \triangleq r = \frac{OCV}{V_{min}} - 1$$

wherein r is the cranking resistance ratio,
$R_b$ is a battery resistance,
$R_s$ is a starter resistance,
OCV is an open circuit voltage during cranking, and
$V_{min}$ is the single datapoint comprising the minimum cranking voltage captured during the engine cranking.

15. The method of claim 13, wherein the cranking resistance ratio is normalized in accordance with the following relationship:

$$r_0 = r \times \frac{1 + \beta(T_s - Tnom)}{1 - \alpha(T_b - Tnom)}$$

wherein $r_0$ is the normalized cranking resistance ratio,
r is the cranking resistance ratio,
$T_b$ is the temperature of the battery,
$T_s$ is starter temperature,
Tnom is a nominal battery temperature, and
α and β are predetermined temperature coefficients.

16. The method of claim 15, wherein the starter temperature $T_s$ is based upon the battery temperature $T_b$.

17. The method of claim 16, wherein the starter temperature $T_s$ is determined in accordance with the following relationship:

$$T_s = \begin{cases} T_b + ae^{b \cdot t_{off}}, & \text{if } t_{off} \leq Th1 \\ T_b, & \text{if } t_{off} > Th1 \end{cases}$$

wherein $t_{off}$ is engine-off time,
- a and b are application-specific fitting coefficients that are pre-calibrated for a known system, and
- Th1 is a threshold time period for engine-off indicating a period of time required for the starter motor to achieve ambient temperature.

\* \* \* \* \*